United States Patent
Kitano et al.

(10) Patent No.: US 8,026,143 B2
(45) Date of Patent: Sep. 27, 2011

(54) SEMICONDUCTOR ELEMENT AND MANUFACTURING METHOD THEREOF

(75) Inventors: Naomu Kitano, Ichikawa (JP); Takashi Minami, Fuchu (JP); Motomu Kosuda, Machida (JP); Heiji Watanabe, Suita (JP)

(73) Assignee: Canon Anelva Corporation, Kanagawa (JP)

( * ) Notice: Subject to any disclaimer, the term of this patent is extended or adjusted under 35 U.S.C. 154(b) by 172 days.

(21) Appl. No.: 11/933,935

(22) Filed: Nov. 1, 2007

(65) Prior Publication Data

US 2008/0305597 A1 Dec. 11, 2008

(30) Foreign Application Priority Data

Jul. 6, 2007 (JP) .................... 2007-178723

(51) Int. Cl.
*H01L 21/336* (2006.01)
(52) U.S. Cl. .............. 438/287; 438/300; 257/E29.165
(58) Field of Classification Search .................. 438/300, 438/287, 216, 261; 257/E29.162, E29.165
See application file for complete search history.

(56) References Cited

U.S. PATENT DOCUMENTS

| 6,146,998 | A * | 11/2000 | Yamaha et al. ............ 438/653 |
| 6,407,435 | B1 | 6/2002 | Ma et al. |
| 7,115,533 | B2 | 10/2006 | Hayashi et al. ............ 438/785 |
| 7,151,299 | B2 | 12/2006 | Watanabe .................... 257/369 |
| 2005/0233526 | A1 | 10/2005 | Watanabe et al. ............ 438/287 |
| 2005/0247985 | A1 | 11/2005 | Watanabe et al. ............ 257/411 |
| 2006/0194396 | A1 | 8/2006 | Sunil et al. .................... 438/287 |
| 2007/0023842 | A1 | 2/2007 | Jung et al. |

FOREIGN PATENT DOCUMENTS

| JP | 2002-184773 | 6/2002 |
| JP | 2003-249497 | 9/2003 |
| JP | 2003-309188 | 10/2003 |
| JP | 2004-31760 | 1/2004 |
| JP | 2006-24594 | 1/2006 |
| JP | 2006-237371 | 9/2006 |
| KR | 2001-0082118 | 8/2001 |
| KR | 2007-0017756 | 2/2007 |
| WO | 2004/008544 | 1/2004 |

OTHER PUBLICATIONS

H. Arimura, et al., "Improved Electrical Properties of HfTiSiO Gate Dielectrics by Structural Optimization", The Japan Society of Applied Physics and Related Societies, The 54th Spring Meeting, Mar. 27, 2007, No. 2, p. 843. (with Translation).

(Continued)

*Primary Examiner* — Ha Tran T Nguyen
*Assistant Examiner* — Shaun Campbell
(74) *Attorney, Agent, or Firm* — Fitzpatrick, Cella, Harper & Scinto

(57) ABSTRACT

The object of the present invention is to provide a method of manufacturing high permittivity gate dielectrics for a device such as an MOSFET. A HfSiO film is formed by sputtering a Hf metal film on a $SiO_2$ film (or a SiON film) on a Si wafer. A $TiO_2$ film is formed by sputtering a Ti metal film on the HfSiO film and subjecting the Ti metal film to a thermal oxidation treatment. A TiN metal film is deposited on the $TiO_2$ film. The series of treatments are performed continuously, without exposing the films and the wafer to atmospheric air. The resultant $TiN/TiO_2/HfSiO/SiO_2/Si$ structure satisfies the conditions: EOT<1.0 nm, low leakage current, and hysteresis <20 mV.

7 Claims, 6 Drawing Sheets

OTHER PUBLICATIONS

Kazutaka Honda, et al., "Pulsed Laser Deposition and Analysis for Structural and Electrical Properties of $HfO_2$-$TI_2$ Composite Films", Japanese Journal of Applied Physics, vol. 43, No. 4A, 2004, pp. 1571-1576.

Heiji Watanabe, et al., "Thermal Degradation of HfSiON Dielectrics Caused by TiN Gate Electrodes and Its Impact on Electrical Properties", Japanese Journal of Applied Physics, vol. 45, No. 4B, 2006, pp. 2933-2938.

Korean Official Action dated Nov. 28, 2008 in Korean Application No. 10-2007-0080000.

S. Rhee, et al., "Improved electrical and material characteristics of hafnium titanate multi-metal oxide n-MOSFETs with ultra-thin EOT (~8Å) gate dielectric application", IEDM Tech. Dig, 2004, pp. 837-840.

Tomonori Aoyama, et al., "In-situ HfSiON/$SiO_2$ gate dielectric fabrication using hot wall batch system", Int. Workshop Gate Insulators, 2003, pp. 174-179.

I. Barin, et al., "Thermochemical properties of inorganic substances", Springer-Verlag, Berlin, 1973, p. 689.

C. T. Kuo, et al., "Study of sputtered $HfO_2$ thin films on silicon", Thin Solid Films, vol. 213, 1992, pp. 257-264.

David R. Lide, Ed., CRC Handbook of Chemistry and Physics, 80th Edition, New York: CRC Press, 1999, p. 12.

R. E. Newnham, et al., Crystal Structure of $ZrTiO_4$, Journal of the American Ceramic Society—Discussions and Notes, Apr. 1967, p. 216.

C. H. Choi, et al., "Thermally Stable CVD $HfO_xN_y$ Advanced Gate Dielectrics with Poly-Si Gate Electrode", IEEE, 2002, IEDM, pp. 857-860.

K. Eisenbeiser, et al., "Field effect transistors with $SrTIO_3$ gate dielectric on Si", Applied Physics Letters, vol. 76, No. 10, Mar. 6, 2000, pp. 1324-1326.

Keiichi Haraguchi, et al., "A TiO2 Gate Insulator of a 1-nm Equivalent Oxide Thickness Deposited by Electron-Beam Evaporation", Extended Abstracts of the 1999 International Conference on Solid State Devices and Materials, 1999, pp. 376-377.

B. He, et al., "A 1.1 nm Oxide Equivalent Gate Insulator Formed Using $TiO_2$ on Nitrided Silicon", 1998, IEDM, pp. 1038-1040.

C. Hobbs, et al., "Fermi Level Pinning at the PolySi/Metal Oxide Interface", Symposium on VLSI Technology Digest of Technical Papers, 2003, pp. 9-10.

A. Kaneko, et al., "Flatband Voltage Shift Caused by Dopants Diffused from Poly-Si Gate Electrode in Poly-Si/HfSiO/$SiO_2$/Si", Extended Abstracts of the 2003 International Conference on Solid State Devices and Materials, 2003, pp. 56-57.

Laegu Kang, et al., "Electrical Characteristics of Highly Reliable Ultrathin Hafnium Oxide Gate Dielectric", IEEE Electron Device Letters, vol. 21, No. 4, Apr. 2000, pp. 181-183.

Masato Koyama, et al., "Effects of Nitrogen in HfSiON Gate Dielectric on the Electrical and Thermal Characteristics", IEEE, 2002, IEDM, pp. 849-852.

Byoung Hun Lee, et al., "Thermal stability and electrical characteristics of ultrathin hafnium oxide gate dielectric reoxidized with rapid thermal annealing", Applied Physics Letters, vol. 76, No. 14, Apr. 3, 2000, pp. 1926-1928.

A. Paskaleva, et al., "Different current conduction mechanisms through thin high-κ $Hf_xTi_ySi_zO$ films due to the varying Hf to Ti ratio", Journal of Applied Physics, vol. 95, No. 10, May 15, 2004, pp. 5583-5590.

John Robertson, "Band offsets of wide-band-gap oxides and implications for future electronic devices", J. Vac. Sci. Technol. B, vol. 18, No. 3, May/Jun. 2000, pp. 1785-1791.

K. Shiraishi, et al., "Physics in Fermi Level Pinning at the PolySi/Hf-based High-κ Oxide Interface", Symposium on VLSI Technology Digest of Technical Papers, IEEE, 2004, pp. 108-109.

R. B. van Dover, "Amorphous lanthanide-doped $TiO_x$ dielectric films", Applied Physics Letters, vol. 74, No. 20, May 17, 1999, pp. 3041-3043.

Heiji Watanabe, et al., "Impact of Physical Vapor Deposition-Based In situ Fabrication Method on Metal/High-κ Gate Stacks", Japanese Journal of Applied Physics, vol. 46, No. 4B, 2007, pp. 1910-1915.

Heiji Watanabe, et al., "High-quality $HfSi_xO_y$ gate dielectrics fabricated by solid phase interface reaction between physical-vapor-deposited metal-Hf and $SiO_2$ underlayer", Applied Physics Letters, vol. 85, No. 3, Jul. 19, 2004, pp. 449-451.

Heiji Watanabe, et al., "La-silicate gate dielectrics fabricated by solid phase reaction between La Metal and $SiO_2$ underlayers", Applied Physics Letters, vol. 83, No. 17, Oct. 27, 2003, pp. 3546-3548.

Heiji Watanabe, "Ultrathin zirconium silicate gate dielectrics with compositional gradation formed by self-organized reactions", Applied Physics Letters, vol. 81, No. 22, Nov. 25, 2002, pp. 4221-4223.

Heiji Watanabe, "Interface engineering of a $ZrO_2$/$SiO_2$/Si layered structure by in situ reoxidation and its oxygen-pressure-dependent thermal stability", Applied Physics Letters, vol. 78, No. 24, Jun. 11, 2001, pp. 3803-3805.

G. D. Wilk, "High-κ gate dielectrics: Current status and materials properties considerations", Journal of Applied Physics, vol. 89, No. 10, May 15, 2001, pp. 5243-5275.

G. D. Wilk, et al., "Hafnium and zirconium silicates for advanced gate dielectrics", Journal of Applied Physics, vol. 87, No. 1, Jan. 1, 2000, pp. 484-492.

F. Chen, et al., "A study of mixtures of $HfO_2$ and $TiO_2$ as high-κ gate dielectrics", Microelectronic Engineering, vol. 72, 2004, pp. 263-266.

Albert Chin, et al., "High Quality $La_2O_3$ and $Al_2O_3$ Gate Dielectrics with Equivalent Oxide Thickness 5-10Å", Symposium on VLSI Technology Digest of Technical Papers, 2000, pp. 16-17.

M. Copel, et al., "Formation of a stratified lanthanum silicate dielectric", Applied Physics Letters, vol. 78, No. 11, Mar. 12, 2001, pp. 1607-1609.

M. Copel, et al., "Robustness of ultrathin aluminum oxide dielectrics on Si(001)", Applied Physics Letters, vol. 78, No. 18, Apr. 30, 2001, pp. 2670-2672.

M. Copel, et al., "Structure and stability of ultrathin zirconium oxide layers on Si(001)", Applied Physics Letters, vol. 76, No. 4, Jan. 24, 2000, pp. 436-438.

Q. Fang, et al., "Investigation of $TiO_2$-doped $HfO_2$ thin films deposited by photo-CVD", Thin Solid Films, vol. 428, 2003, pp. 263-268.

Massimo V. Fischetti, et al., "Effective electron mobility in Si inversion layers in metal-oxide-semiconductor systems with a high-κ insulator: The role of remote phonon scattering", Journal of Applied Physics, vol. 90, No. 9, Nov. 1, 2001, pp. 4587-4608.

Theodosia Gougousi, et al., "The role of the OH species in high-κ/polycrystalline silicon gate electrode interface reactions", Applied Physics Letters, vol. 80, No. 23, Jun. 10, 2002, pp. 4419-4421.

M. Houssa, et al., "Variation in the fixed charge density of $SiO_x$/$ZrO_2$ gate dielectric stacks during postdeposition oxidation", Applied Physics Letters, vol. 77, No. 12, Sep. 18, 2000, pp. 1885-1887.

K. J. Hubbard, et al., "Thermodynamic stability of binary oxides in contact with silicon", J. Mater. Res., vol. 11, No. 11, Nov. 1996, pp. 2757-2776.

Hiroya Ikeda, et al., "Structural and Electrical Characteristics of $HfO_2$ Films Fabricated by Pulsed Laser Deposition", Jpn. J. Appl. Phys., vol. 41, Pt. 1, No. 4B, Apr. 2002, pp. 2476-2479.

Akitoshi Ishizaka, et al., "Si-$SiO_2$ Interface Characterization by ESCA", Surface Science, vol. 84, 1979, pp. 355-374.

Seiichi Iwata, et al., "Electron spectroscopic analysis of the $SiO_2$/Si system and correlation with metal-oxide-semiconductor device characteristics", J. Appl. Phys., vol. 79, No. 9, May 1, 1996, pp. 6653-6713.

T. S. Jeon, et al., "Thermal stability of ultrathin $ZrO_2$ films prepared by chemical vapor deposition on Si(100)", Applied Physics Letters, vol. 78, No. 3, Jan. 15, 2001, pp. 368-370.

R. S. Johnson, et al., "Electron trapping in non-crystalline Ta- and Hf-Aluminates for gate dielectric applications in aggressively scaled silicon devices", Solid-State Electronics, vol. 46, 2002, pp. 1799-1805.

Hiroyuki Kageshima, et al., "Universal Theory of Si Oxidation Rate and Importance of Interfacial Si Emission", Jpn. J. Appl. Phys. vol. 38, Pt. 2, No. 9A/B, Sep. 15, 1999, pp. L971-L974.

Takaaki Kawahara, et al., "Effect of Hf Sources, Oxidizing Agents, and $NH_3/Ar$ Plasma on the Properties of $HfAlO_x$ Films Prepared by Atomic Layer Deposition", Japanese Journal of Applied Physics, vol. 43, No. 7A, 2004, pp. 4129-4134.

Takaaki Kawahara, et al., "Effects of Hf Sources, Oxidizing Agents and $NH_3$ Radicals on Properties of $HfAlO_x$ Films Prepared by Atomic Layer Deposition", IWGI, 2003, pp. 32-37.

Jakub Kedzierski, et al., "Metal-gate FinFET and fully-depleted SOI devices using total gate silicidation", IEDM, 2002, pp. 10.1.1-10.1.4.

S. J. Lee, et al., "High Quality Ultra Thin CVD $HfO_2$ Gate Stack with Poly-Si Gate Electrode", IEDM, 2000, pp. 2.4.1-2.4.4.

M. Lemberger, et al., "Zirconium silicate films obtained from novel MOCVD precursors", Journal of Non-Crystalline Solids, vol. 322, 2003, pp. 147-153.

Kwan-Yong Lim, et al., "Electrical characteristics and thermal stability of $n^+$ polycrystalline-Si/$ZrO_2$/$SiO_2$/Si metal-oxide-semiconductor capacitors", Journal of Applied Physics, vol. 91, No. 1, Jan. 1, 2002, pp. 414-419.

G. Lucovsky, "Electronic structure of high-κ transition-metal and rare-earth gate dielectrics for aggressively-scaled silicon devices", IWGI, 2001, pp. 14-25.

Z. J. Luo, et al., "Temperature dependence of gate currents in thin $Ta_2O_5$ and $TiO_2$ films", Applied Physics Letters, vol. 79, No. 17, Oct. 22, 2001, pp. 2803-2804.

L. Manchanda, et al., "Si-Doped Aluminates for High Temperature Metal-Gate CMOS: Zr-Al-Si-O, A Novel Gate Dielectric for Low Power Applications", IEDM, 2000, pp. 2.2.1-2.2.4.

Makoto Miyamura, et al., "Origin of Flatband Voltage Shift in Poly-Si/Hf-Based High-κ Gate Dielectrics and Flatband Voltage Dependence on Gate Stack Structure", Japanese Journal of Applied Physics, vol. 43, No. 11B, 2004, pp. 7843-7847.

D. A. Muller, et al., "The electronic structure at the atomic scale of ultrathin gate oxides", Nature, vol. 399, Jun. 24, 1999, pp. 758-761.

T. Ngai, et al., "Electrical properties of $ZrO_2$ gate dielectric on SiGe", Applied Physics Letters, vol. 76, No. 4, Jan. 24, 2000, pp. 502-504.

G. A. Niklasson, et al., "Analysis of current-voltage characteristics of metal-insulator composite films", J. Appl. Phys. vol. 59, No. 3, Feb. 1, 1986, pp. 980-982.

Albena Paskaleva, et al., "Electrical characterization of zirconium silicate films obtained from novel MOCVD precursors", Microelectronics Reliability, vol. 43, 2003, pp. 1253-1257.

J. Perriere, et al., "Observation of Short-Range Oxygen Migration and Oxygen Exchange During Low Temperature Plasma Anodization of Silicon Through Thin $ZrO_2$ Films", Thin Solid Films, vol. 95, 1982, pp. 309-314.

S. Pidin, et al., "Low Standby Power CMOS with $HfO_2$ Gate Oxide for 100-nm Generation", Symposium on VLSI Technology Digest of Technical Papers, 2002, pp. 28-29.

Wen-Jie Qi, et al., "Electrical and reliability characteristics of $ZrO_2$ deposited directly on Si for gate dielectric application", Applied Physics Letters, vol. 77, No. 20, Nov. 13, 2000, pp. 3269-3271.

J. Robertson, "Band structures and band offsets of high K dielectrics on Si", Applied Surface Science, vol. 190, 2002, pp. 2-10.

S. Saito, et al., "Unified Mobility Model for High-κ Gate Stacks", IEDM, 2003, pp. 33.3.1-33.3.4.

Kensuke Takahashi, et al., "Dual Workfunction Ni-Silicide/HfSiON Gate by Phase-Controlled Full-Silicidation (PC-FUSI) Technique for 45nm-node LSTP and LOP Devices", IEDM, 2004, pp. 4.4.1-4.4.4.

Kensuke Takahashi, et al., "High-Mobility Dual Metal Gate MOS Transistors with High-κ Gate Dielectrics", Japanese Journal of Applied Physics, vol. 44, No. 4B, 2005, pp. 2210-2213.

K. Torii, et al., "Fixed charge-induced mobility degradation and its recovery in MISFETs with $Al_2O_3$ gate dielectric", IWGI, 2001, pp. 230-232.

Heiji Watanabe, "Interfacial Reactions of $ZrO_2$/$SiO_2$/Si Layered Structures", Extended Abstracts of the 2001 International Conference on Solid State Devices and Materials, 2001, pp. 492-493.

Heiji Watanabe, "Roughness at $ZrO_2$/Si interfaces induced by accelerated oxidation due to the metal oxide overlayer", Applied Physics Letters, vol. 83, No. 20, Nov. 17, 2003, pp. 4175-4177.

Heiji Watanabe, et al., "Termal decomposition of ultrathin oxide layers on Si(111) surfaces mediated by surface Si transport", Appl. Phys. Left., vol. 70, No. 9, Mar. 3, 1997, pp. 1095-1097.

G. D. Wilk, et al., "Electrical properties of hafnium silicate gate dielectrics deposited directly on silicon", Applied Physics Letters, vol. 74, No. 19, May 10, 1999, pp. 2854-2856.

G. D. Wilk, et al., "Improved Film Growth and Flatband Voltage Control of ALD $HfO_2$ and Hf-Al-O with $n^+$ poly-Si Gates using Chemical Oxides and Optimized Post-Annealing", Symposium on VLSI Technology Digest of Technical Papers, 2002, pp. 88-89.

G. D. Wilk, et al., "Stable zirconium silicate gate dielectrics deposited directly on silicon", Applied Physics Letters, vol. 76, No. 1, Jan. 3, 2000, pp. 112-114.

Takeshi Yamaguchi, et al., "Study on Zr-Silicate Interfacial Layer of $ZrO_2$-MIS Structure Fabricated by Pulsed Laser Ablation Deposition Method", Extended Abstracts of the 2000 International Conference on Solid State Devices and Materials, 2000, pp. 228-229.

Masanori Yamaoka, et al., "Characterization of Hafnium Diffusion into Thermally-Grown $SiO_2$ on Si(100)", Extended Abstracts of the 2003 International Conference on Solid State Devices and Materials, 2003, pp. 810-811.

Zhen Xu, "Polarity effect on the temperature dependence of leakage current through $HfO_2$/$SiO_2$ gate dielectric stacks", Applied Physics Letters, vol. 80, No. 11, Mar. 18, 2002, pp. 1975-1977.

W. J. Zhu, et al., "Current Transport in Metal/Hafnium Oxide/Silicon Structure", IEEE Electron Device Letters, vol. 23, No. 2, Feb. 2002, pp. 97-99.

Stefan Zürcher, et al., "Hafnium Titanium Silicate High-κ Dielectric Films Deposited by MOCVD Using Novel Single Source Precursors", Electrochemical Society Proceedings, vol. 2003-08, pp. 863-871.

International Technology Roadmap for Semiconductors, 2001 Edition, Front End Processes, pp. 1-44.

* cited by examiner

TiOx FORMING TEMPERATURE (400°C)

TiOx FORMING TEMPERATURE (850°C)

TiOx FORMING TEMPERATURE (600°C)

TiOx FORMING TEMPERATURE (400°C)

SEMICONDUCTOR ELEMENT AND MANUFACTURING METHOD THEREOF

BACKGROUND OF THE INVENTION

1. Field of the Invention

The present invention relates to a method for forming stacked films by stacking high permittivity gate dielectrics each having different relative permittivity constants, and for depositing a metal electrode material film on the stacked films, in manufacture of a metal oxide semiconductor field effect transistor (MOSFET). In particular, the present invention relates to a method for causing the Equivalent Oxide Thickness (EOT) of the MOSFET to be equal to or smaller than 1.0 nm.

2. Related Background Art

In manufacture of the MOSFET, today, the MOSFET is manufactured in combination where a silicon dioxide ($SiO_2$) film is used as the gate dielectrics thereof, and polysilicon is used as the gate electrode thereof. In order to improve the performance of an integrated circuit, the design rule thereof has been reduced gradually. Being accompanied with this, thinning of the gate dielectrics is required. However, there is limitation in thinning of the gate dielectrics using the silicon dioxide ($SiO_2$) film. In other words, thinning beyond the limit results in increase of leakage current beyond the tolerance level.

Therefore, today, application of gate dielectrics having a relative permittivity constant larger than that of the silicon dioxide ($SiO_2$) film is considered. The gate dielectrics is referred to as high permittivity gate dielectrics. When the high permittivity gate dielectrics is used as the gate dielectrics, the gate electrode also have to be changed into a metal electrode. It is because of the two reasons described below. A first reason is in that polysilicon does not match with almost all of high permittivity gate dielectrics. A second reason is in that if polysilicon is used, a depletion region is formed in the interface between the polysilicon and the high permittivity gate dielectrics, thereby, the EOT of the MOSFET becomes larger, resulting in reduction of the capacitance thereof.

Here, the Equivalent Oxide thickness (EOT) will be described. The electric film thickness obtained by means of back calculation by assuming the gate dielectrics material is the silicon dioxide ($SiO_2$) film, without depending on the types of the gate dielectrics, is referred to as the EOT (Equivalent Oxide thickness) of the silicon dioxide ($SiO_2$) film. In other words, when the relative permittivity constant of the dielectrics is denoted as $\in h$, the relative permittivity constant of the silicon dioxide ($SiO_2$) film is denoted as $\in o$, and the thickness of the dielectrics is denoted as dh, the EOT of the silicon dioxide ($SiO_2$) film, de, is represented by the following formula 1.

$$de = dh \times (\in o / \in h) \quad (1)$$

When a material having a relative permittivity constant $\in h$ being larger than the relative permittivity constant $\in o$ of the silicon dioxide ($SiO_2$) film is used as the gate dielectrics, the above-mentioned formula 1 indicates that the EOT of the silicon dioxide ($SiO_2$) film becomes equivalent to the thickness of the silicon dioxide ($SiO_2$) film being thinner than the thickness of the gate dielectrics. In addition, the relative permittivity constant $\in o$ of the silicon dioxide ($SiO_2$) film is an order of 3.9. Therefore, for example, for a film composed of a high permittivity gate dielectrics material having a relative permittivity constant $\in h$ of 39, even if the physical film thickness of the high permittivity gate dielectrics material is 15 nm, the EOT (electric film thickness) of the silicon dioxide ($SiO_2$) film becomes 1.5 nm, thereby, the tunnel current thereof can be largely reduced, while the capacitance value of the gate dielectrics being caused to be equivalent to that of a silicon dioxide ($SiO_2$) film having a thickness of 1.5 nm.

Today, $HfO_2$, HfSiO or HfSiON has a high degree of expectation as the high permittivity gate dielectrics. Since the relative permittivity constants of them are an order of 10 to 20, being calculated by using the above-mentioned formula 1, the thickness of the dielectrics becomes an order of 6 to 7. However, since in a practical structure a silicon dioxide ($SiO_2$) film having a thickness of an order of 1 nm, is required between the silicon wafer and the high permittivity gate dielectrics, the film thickness of the Hf-based high permittivity gate dielectrics becomes as thin as an order of 1 to 2 nm, it is difficult to reduce the gate leakage current while satisfying the condition: EOT<1 nm.

Therefore, Honda et al. (JJAP Vol. 43 (2004) p. 1571), formed $HfO_2$ film on a Si wafer, stacked $SiO_2$ having a relative permittivity constant being different from that of the $HfO_2$ film, on the $HfO_2$ film, by means of a pulsed laser deposition method, exposed them to atmospheric air, subsequently, formed a metal electrode film, and then evaluated electric properties of the resultant stacked films. As the result, the hysteresis thereof was 50 to 300 mV, and the EOT thereof was greater than 1 nm (H, Watanabe et al., Jpn. J. Appl. Phys. 45 (2006) 2933).

In this manner research of Metal/High-k gate stack has been energetically advanced as the technology of reducing power consumption and improving the performance of the MOSFET. Although it has been reported that a Hf silicate film has excellent properties as a High-k gate dielectrics material, further reduction of the EOT is required. Since Ti-based oxides have a high relative permittivity constant, improving performance of various kinds of High-k film materials by means of adding Ti has been attempted. Moreover, a phenomenon that forming a $TiO_2$ layer by means of a TiN/HfSiON interfacial reaction reduces the leakage current with little increase of the EOT, has been reported (H. Watanabe et al., Jpn. J. Appl. Phys. 45 (2006) 2933).

In the present invention, the object is to provide an optimum structure of a HfTiSiO film for achieving ultra-thin High-k gate dielectrics satisfying the condition: EOT<1 nm. It is a subject to satisfy the conditions: EOT<1.0 nm, low leakage current, and hysteresis<20 mV, by using a stack structure of Hf-based high permittivity gate dielectrics/Ti-based high permittivity gate dielectrics having a relative permittivity constant being different from that of the Hf-based high permittivity gate dielectrics.

SUMMARY OF THE INVENTION

A first aspect of the present invention is a method for forming first high permittivity gate dielectrics on a silicon dioxide ($SiO_2$) film (for example, an $SiO_2$ film) or a silicon oxynitrided (SiON) film (for example, an SiON film), forming second high permittivity gate dielectrics having a relative permittivity constant being different from that of the first high permittivity gate dielectrics, and forming a metal electrode material on the resultant second high permittivity gate dielectrics, and the above-mentioned formation steps are performed continuously.

As an embodiment example of the first aspect of the present invention, the formation of the first high permittivity gate dielectrics includes a first step for depositing a first metal film on a silicon dioxide ($SiO_2$) film, or a silicon oxynitrided (SiON) film by means of a sputtering method using a metal target in an atmosphere where oxidation reaction of metal atoms hardly occurs, and a second step for forming the first high permittivity gate dielectrics by subjecting the metal film and the silicon dioxide ($SiO_2$) film or the silicon oxynitrided (SiON) film to a thermal oxidation treatment (annealing).

The first and the second steps of the formation of the first high permittivity gate dielectrics, are performed continuously, without exposing the first high permittivity gate dielectrics to atmospheric air.

The metal deposited in the first step includes at least hafnium.

The second step is performed at a heating temperature of 500° C. to 900° C.

The second step is performed at a heating temperature of 500° C. to 900° C., and at an oxidation treatment pressure of $1 \times 10^{-3}$ [Pa] to 10 [Pa].

As another embodiment example of the first aspect of the present invention, the formation of the second high permittivity gate dielectrics includes a third step for depositing a second metal film on the resultant first high permittivity gate dielectrics formed in the second step, by means of a sputtering method using a metal target, in an atmosphere where oxidation reaction of metal atoms hardly occurs, and a fourth step for forming the second high permittivity gate dielectrics by subjecting the second metal film to a thermal oxidation treatment (annealing).

The third and the fourth steps are performed continuously without exposing to the second high permittivity gate dielectrics to atmospheric air.

The metal deposited in the third step includes at least titanium.

The fourth step is performed at a heating temperature of 200° C. to 400° C.

The fourth step is performed at a heating temperature of 200° C. to 400° C., and at an oxidation treatment pressure of $1 \times 10^{-3}$ [Pa] to 10 [Pa].

As another embodiment example of the first aspect of the present invention, the metal electrode film is formed by means of a reactive sputtering method using deposition equipment enabling oxygen and nitrogen or nitrogen monoxide, or oxygen and nitrogen to be introduced simultaneously.

The metal electrode film is metal composite of binary or more system formed by discharging at least two or more cathodes simultaneously.

The metal electrode film includes one kind, or two kinds or more metal elements selected from the group consisted of Zr, C, Hf, Ta, Ti, Al, Ru, Si, Ni, Pt, Ir, Er, Yb, La, Dy, Y, Gd, Co, and W.

A second aspect of the present invention is that in a method including: depositing metal composite films on a silicon dioxide ($SiO_2$) film or a silicon oxynitrided (SiON) film by means of a co-sputtering method using different metal targets in an atmosphere where oxidation reaction of metal atoms hardly occurs; subjecting the metal composite films to a thermal oxidation treatment (annealing); and forming a metal electrode material on the high permittivity gate dielectrics formed by being subjected to the thermal oxidation treatment; the above-mentioned formation steps are performed continuously.

The deposited metal composite films include at least either hafnium or titanium.

The thermal oxidation of the metal composite films is performed at a heating temperature of 500° C. to 900° C.

The thermal oxidation of the metal composite films is performed at a heating temperature of 500° C. to 900° C., and at an oxidation treatment pressure of $1 \times 10^{-3}$ [Pa] to 10 [Pa].

As an embodiment example of the second aspect of the present invention, the metal electrode film is formed by means of a reactive sputtering method using deposition equipment enabling oxygen and nitrogen or nitrogen monoxide, or oxygen and nitrogen to be introduced simultaneously.

As another embodiment example of the second aspect of the present invention, the metal electrode film is metal composite films of binary or more system formed by discharging at least two or more cathodes simultaneously.

As the other embodiment example of the second aspect of the present invention, the metal electrode film includes one kind, or two kinds or more metal elements selected from the group consisted of Zr, C, Hf, Ta, Ti, Al, Ru, Si, Ni, Pt, Ir, Er, Yb, La, Dy, Y, Gd, Co, and W.

A third aspect of the present invention is in that in the method of manufacturing a semiconductor device including: depositing metal stacked films on a silicon dioxide ($SiO_2$) film or a silicon oxynitrided (SiON) film by means of a co-sputtering method using different metal targets in an atmosphere where oxidation reaction of metal atoms hardly occurs; subjecting the metal stacked films to a thermal oxidation treatment; and forming a metal electrode material on the high permittivity gate dielectrics formed by being subjected to the thermal oxidation treatment; the above-mentioned formation steps are performed continuously.

As an embodiment example of the third aspect of the present invention, the deposited metal stacked films include at least either hafnium or titanium.

As another embodiment example of the third aspect of the present invention, the thermal oxidation treatment is performed at a heating temperature of 500° C. to 900° C.

As another embodiment example of the third aspect of the present invention, the thermal oxidation treatment is performed at a heating temperature of 500° C. to 900° C., and at an oxidation treatment pressure of $1 \times 10^{-3}$ [Pa] to 10 [Pa].

As another embodiment example of the third aspect of the present invention, the metal electrode film is formed by means of a reactive sputtering method using deposition equipment enabling oxygen and nitrogen or nitrogen monoxide, or oxygen and nitrogen to be introduced simultaneously.

As another embodiment example of the third aspect of the present invention, the metal electrode film is metal composite films of binary or more system formed by discharging at least two or more cathodes simultaneously.

As another embodiment example of the third aspect of the present invention, the metal electrode film includes one kind, or two kinds or more metal elements selected from the group consisted of Zr, C, Hf, Ta, Ti, Al, Ru, Si, Ni, Pt, Ir, Er, Yb, La, Dy, Y, Gd, Co, and W.

The method of manufacturing an MOS field effect transistor using the technique for forming high permittivity gate dielectrics of the present invention includes forming first high permittivity gate dielectrics on a silicon dioxide ($SiO_2$) film or a silicon oxynitrided (SiON) film, forming second high permittivity gate dielectrics having a relative permittivity constant different from that of the first high permittivity gate dielectrics; and forming a metal electrode material on the second high permittivity gate dielectrics, and where the above-mentioned forming steps of at least the first and the second high permittivity gate dielectrics are performed continuously, without exposing the first and the second high permittivity gate dielectrics to atmospheric air.

The first and the second high permittivity gate dielectrics are the gate dielectrics of the MOSFET, and the metal electrode material is the gate electrode thereof.

In an embodiment example of the present invention, the first high permittivity gate dielectrics is an oxide film including Hf, the second high permittivity gate dielectrics is an oxide film including Ti, and the metal electrode material includes one kind, or two kinds or more metal elements selected from the group consisted of Zr, C, Hf, Ta, Ti, Al, Ru, Si, Ni, Pt, Ir, Er, Yb, La, Dy, Y, Gd, Co, and W.

In another embodiment example, the first high permittivity gate dielectrics is HfSiO, and the second high permittivity gate dielectrics is $TiO_2$.

DESCRIPTION OF THE PREFERRED EMBODIMENTS

Figure 1A:
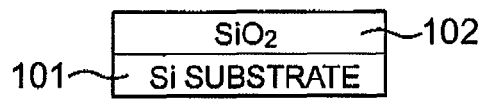
FIG. 1A is a schematic view of a stack structure of high permittivity gate dielectrics and a metal electrode film, formed by using the method of the present invention.

According to the outline of one embodiment example of the present invention, as a method for forming high permittivity gate dielectrics, a Hf metal film having a thickness of 0.1 nm to 0.7 nm is formed on a silicon dioxide ($SiO_2$) film ($SiO_2$ (or a silicon oxynitrided (SiON) film/SiON)) having a thickness of 1 nm to 2 nm by means of a sputtering method. The resultant Hf metal film is transferred into a heat treatment chamber having an oxygen partial pressure being equal to or smaller than $1.0 \times 10^{-8}$ [Pa], without being exposed to atmospheric air, is subjected to a thermal oxidation treatment at a wafer temperature of 500° C. 900° C., and an oxygen partial pressure of $1 \times 10^3$ [Pa] to 10 [Pa], and a Hf silicate film is formed. The resultant Hf silicate film is transferred into a sputtering chamber having an ultimate pressure equal to or smaller than $1.0 \times 10^{-6}$ [Pa], without being exposed to atmospheric air, and a Ti metal film of 0.1 nm to 1.0 nm is formed on the Hf silicate by means of a sputtering method. The resultant Ti/Hf silicate stacked high permittivity gate dielectrics is transferred into a heat treatment chamber having an oxygen partial pressure being equal to or smaller than $1.0 \times 10^{-8}$ [Pa], without being exposed to atmospheric air, and a $TiO_2$ film is formed on the Hf silicate at a wafer temperature of 200° C. 400° C., and an oxygen partial pressure of $1 \times 10^{-3}$ [Pa] to 10 [Pa], without occurrence of the reaction of the Ti film and the Hf silicate film. After being formed, $TiO_2$/Hf silicate stacked high permittivity gate dielectrics is transferred into a metal film deposition chamber, without being exposed to atmospheric air, and a metal electrode film is formed.

As an example, a procedure when TiN/$TiO_2$/HfSiO/$SiO_2$/Si structure is formed, will be described. First, the wafer made of a material such as, for example, single crystal silicon having a (100) plane orientation, which is further doped with phosphorus, and has a resistant value being controlled to be within a range of 2 to 10 Ωcm, is used. A silicon dioxide ($SiO_2$) film is formed on the surface of the wafer by removing metals, organic materials, native oxide film etc. from the surface by means of a known RCA cleaning method etc., exposing clean silicon atoms on the surface, and oxidizing them. The method of the oxidation may be any kinds of technique as long as the method is a technique such as a thermal oxidation method and a radical oxidation method, that can obtain a good silicon interface. However, since if the thickness of the silicon dioxide ($SiO_2$) film is too thick, a low EOT cannot be obtained, it is desirable that the thickness of the silicon dioxide ($SiO_2$) film is 1 nm to 2 nm.

The resultant silicon dioxide ($SiO_2$) film is transferred from a load lock chamber into a metal film deposition chamber through a transfer chamber, without being exposed to atmospheric air. A Hf film is formed on the transferred silicon dioxide ($SiO_2$) film by means of a sputtering method. It is desirable that the atmosphere in the metal film deposition chamber is such an atmosphere where an oxidation reaction of the metal film hardly occurs therein. For example, before sputtering, oxygen and moisture etc. should be removed as much as possible by pumping inside the treatment chamber of the sputtering equipment to be in ultrahigh vacuum, so as not to oxidize the metal film. In addition, other than the RCA sputtering method, the method of the equipment for performing sputtering may be any treatment method such as a DC magnetron sputtering method and a RF magnetron sputtering method.

Next, the wafer having a Hf film formed thereon is transferred into the heat treatment chamber reached to a desired heating temperature, without being exposed to atmospheric air, and subjected to a thermal oxidation treatment for a predetermined time by introducing oxygen immediately after being installed to the wafer holder, and a HfSiO film is formed on the wafer. However, the metal film deposit thickness, the heating temperature, the oxygen partial pressure for treatment, and the time for the thermal oxidation treatment, have to be determined so that a as thin as possible silicon dioxide (SiO$_2$) film is present between the silicon and the resultant HfSiO film.

Next, the wafer having the HfSiO film formed thereon is transferred from the heat treatment chamber into the metal film deposition chamber through the transfer chamber, without being exposed to atmospheric air. A Ti film is formed on the transferred Hf silicate film by means of a sputtering method. It is desirable that the atmosphere in the metal film deposition chamber is such an atmosphere where an oxidation reaction of the metal film hardly occurs therein. For example, before sputtering, oxygen and moisture etc. should be removed as much as possible by pumping inside the treatment chamber of the sputtering equipment to be in ultrahigh vacuum, so as not to oxidize the metal film. In addition, other than the RCA sputtering method, the method of the equipment for performing sputtering may be any treatment method such as a DC magnetron sputtering method and a RF magnetron sputtering method.

Further, the wafer where a Ti film is formed on a HfSiO film, is transferred into the heat treatment chamber reached to a desired heating temperature through the transfer chamber, without being exposed to atmospheric air, and subjected to a thermal oxidation treatment by introducing oxygen for a predetermined time immediately after being installed to the wafer holder, and a TiO$_2$ film is formed on the HfSiO film.

Finally, the TiO$_2$/HfSiO stacked high permittivity gate dielectrics formed by the above-mentioned manner is transferred into the metal film deposition chamber through the transfer chamber without being exposed to atmospheric air, and a TiN film is formed by using Ti as a target and introducing a reactive gas N$_2$ in the chamber.

EMBODIMENT EXAMPLES

An embodiment example applying the present invention will be described with reference to FIGS. 1A to 1F and 2. In FIGS. 1A to 1F, a structure in a process for forming high permittivity gate dielectrics is illustrated. In FIGS. 1A to 1F, a Si wafer 101, a silicon dioxide (SiO$_2$) film 102, a Hf metal film 103, Hf silicate film 104, a Ti film 105, a TiO$_2$ film 106, and a metal electrode film (a TiN film) 107, are illustrated.

Figure 2:
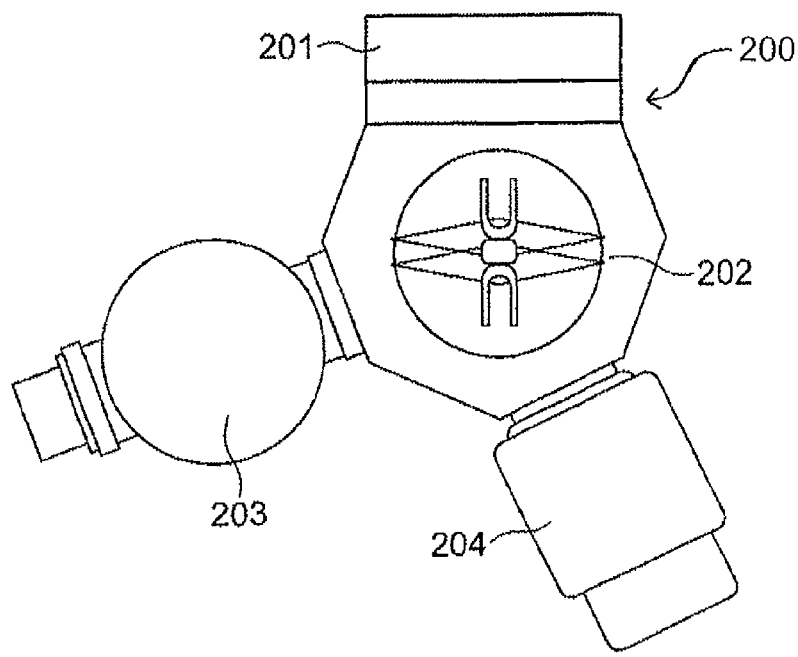
FIG. 2 is a configuration view of equipment for embodying the method of the present invention.

FIG. 2 is a view illustrating the structure of the semiconductor manufacturing equipment 200 for forming high permittivity gate dielectrics according to the present invention. A load lock chamber 201 is divided with respect to the transfer chamber 202 through a gate valve which is not illustrated in the figure, and, thereby, the transfer chamber 202 is shut off from atmospheric air. The load lock chamber 201 is provided with an automatic wafer transfer mechanism, and thereby a wafer before treatment or after treatment can be loaded or unloaded while the vacuum state of the transfer chamber 202 being maintained. The transfer chamber 202 has not only a function of charging/discharging the wafer through the load lock chamber 201, but also functions of maintaining a high vacuum state and automatically transferring the wafer between sputtering equipment 203 and a heat treatment chamber 204 without oxidizing the wafer and polluting the wafer with impurities. The sputtering equipment 203 is connected to the transfer chamber 202 through the gate valve. Similarly, the heat treatment chamber 204 is also connected to the transfer chamber 202 through the gate valve.

As the wafer 101, a p-typed single crystal silicon wafer having a diameter of 200 mm, was used. First, the surface of the wafer 101 is cleaned by means of RCA cleaning, and the impurities and the native oxide film of the surface were removed. Next, being transferred into rapid thermal oxidation treatment equipment (not illustrated in figures), the wafer 101 was subjected to thermal oxidation at a temperature of 1000° C. in an oxygen atmosphere. As illustrated in FIG. 1A, this caused a 1.6 nm thick silicon dioxide (SiO$_2$) film 102 to be formed on the surface of the wafer 101.

Followed by, the wafer 101 is set to the load lock chamber 201 of cluster-type equipment illustrated in FIG. 2, and, after reducing the pressure inside the load lock chamber 201 to $3.0\times10^{-5}$ [Pa], the wafer 101 was transferred into DC magnetron sputtering equipment 203 through the transfer chamber 202. As the target of the sputtering equipment 203, Hf was used. It is desirable that the pressure inside the sputtering equipment 203 is reduced to a value equal to or smaller than $3.0\times10^{-6}$ [Pa] before the wafer 101 is transferred. Since in the sputtering equipment 203, the target is installed aslant to the wafer 101, the sputtering equipment 203 can mount a plurality of targets simultaneously. Further, a wafer holder for installing the wafer 101 thereon has a mechanism rotating at arbitrary number of rotations.

Followed by, by introducing an Ar gas having a flow of 20 sccm, the pressure inside the chamber of the sputtering equipment 203 was kept to 0.02 Pa.

Figure 1B:
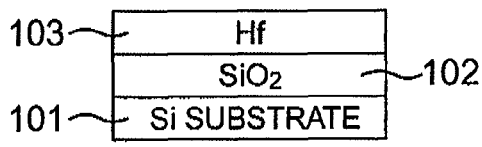
FIG. 1B is a schematic view of another stack structure of high permittivity gate dielectrics and a metal electrode film, formed by using the method of the present invention.

Followed by, plasma was generated by applying DC of 100 W to the target, and the wafer was subjected to sputtering of Hf atoms constituting the target. The sputtered Hf atoms flied to the direction of the wafer 101 supported at a position facing to the target, and was deposited on the silicon dioxide (SiO$_2$) film 102, and thereby a metal film 103 was formed on the silicon dioxide (SiO$_2$) film 102. According to the treatment, as illustrated in FIG. 1B, a 0.5 nm thick Hf film 103 was formed on the silicon dioxide (SiO$_2$) film 102.

After that, the wafer 101 was transferred into the heat treatment chamber 204. The atmosphere inside the transfer chamber 202 was controlled to be in ultrahigh vacuum where residual oxygen was very few, so that the Hf film deposited by means of the sputtering treatment is not oxidized when the wafer was transferred. The oxygen partial pressure inside the heat treatment chamber 204 before the wafer 101 was transferred therein, was set to a value equal to or smaller than $1.0\times10^{-8}$ [Pa] so that the wafer was not oxidized even if the Hf film having a strong absorptive property of oxygen was transferred therein. Moreover, the wafer heating mechanism was required to be a desired preset temperature. In the present embodiment example, the wafer 101 was transferred into the heat treatment chamber 204 in a state when the wafer heating mechanism was set to 850° C.

Figure 1C:
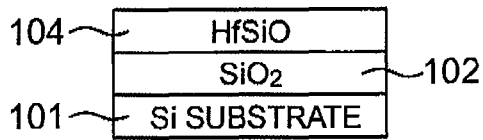
FIG. 1C is a schematic view of another stack structure of high permittivity gate dielectrics and a metal electrode film, formed by using the method of the present invention.

Immediately after the wafer was transferred into the heat treatment chamber, and installed to the wafer holder, oxygen was introduced into the chamber to a desired pressure. In the present embodiment example, the wafer was subjected to a thermal oxidation treatment by introducing 10 sccm of oxygen gas into the heat treatment chamber 204, and keeping the pressure inside the heat treatment chamber 204 to 0.1 [pa], and as illustrated in FIG. 1C, as a metal silicate film 104, a Hf silicate film was formed.

After that, again, the wafer 101 was transferred into the DC magnetron sputtering equipment 203 through the transfer chamber 202. The atmosphere inside the transfer chamber 202 during transferring the wafer was controlled to be in ultrahigh vacuum where the residual oxygen was very few, so that pollution of impurities due do carbon was prevented from occurring on the Hf silicate film formed by the above-mentioned manner, and the surface of the Hf silicate film was not oxidized. As the target of the sputtering equipment 203, Ti was used.

Figure 1D:
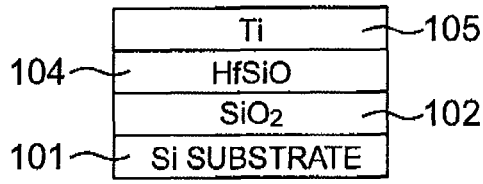
FIG. 1D is a schematic view of another stack structure of high permittivity gate dielectrics and a metal electrode film, formed by using the method of the present invention.

Followed by, the pressure inside the sputtering equipment 203 was kept to 0.02 Pa by introducing 20 sccm Ar gas into the sputtering equipment 203. The sputtered Ti atoms flied to the direction of the wafer 101 supported at a position facing to the target, and was deposited on the Hf silicate film 104, and thereby a Ti film 105 was formed on the Hf silicate film 104. According to the treatment, as illustrated in FIG. 1D, a 0.5 nm thick Ti film 105 was formed on the Hf silicate film 104.

After that, again, the wafer 101 was transferred into the heat treatment chamber 204 through the transfer chamber 202. At that time, the atmosphere inside the transfer chamber 202 was desirable to be in ultrahigh vacuum where the residual oxygen was very few, so that the Ti film deposited by means of the sputtering treatment was not oxidized. The oxygen partial pressure inside the heat treatment chamber 204 before the wafer 101 was transferred therein, was equal to or smaller than $1.0 \times 10^{-8}$ [Pa], thereby, the wafer was not oxidized even if the Ti film having a strong absorptive property of oxygen was transferred therein. Moreover, the wafer heating mechanism was required to be a desired preset temperature. In the present embodiment example, the wafer 101 was transferred into the heat treatment chamber 204 in a state when the wafer heating mechanism was set to 400° C.

Figure 1E:
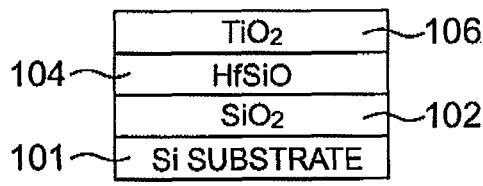
FIG. 1E is a schematic view of another stack structure of high permittivity gate dielectrics and a metal electrode film, formed by using the method of the present invention.

Immediately after the wafer was transferred into the heat treatment chamber, and installed to the wafer holder, oxygen was introduced into the chamber to a desired pressure. In the present embodiment example, the wafer was subjected to a thermal oxidation treatment by introducing 10 sccm of oxygen gas into the heat treatment chamber 204, and keeping the pressure inside the heat treatment chamber 204 to 0.1 [pa], and as illustrated in FIG. 1E, as a metal oxide film 106, a Ti oxide film ($TiO_2$ or $TiO_x$) was formed.

After that, again, the wafer 101 was transferred into the DC magnetron sputtering equipment 203 through the transfer chamber 202. The atmosphere inside the transfer chamber 202 during transferring the wafer was controlled to be in ultrahigh vacuum where the residual oxygen was very few, so that the surface of the $TiO_2$ (or $TiO_x$) film formed by the above-mentioned manner, was not oxidized. As the target of the sputtering equipment 203, Ti was used.

Followed by, by introducing an Ar gas having a flow of 20 sccm, and nitrogen gas having a flow of 15 sccm as a nitrogen source, were introduced simultaneously, and the pressure inside the chamber of the sputtering equipment 203 was kept to 0.03 Pa.

Figure 1F:
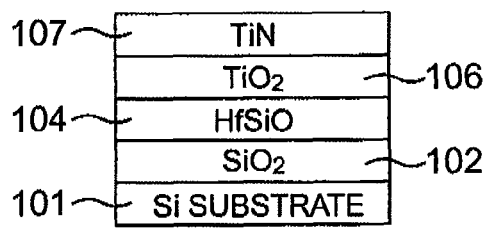
FIG. 1F is a schematic view of another stack structure of high permittivity gate dielectrics and a metal electrode film, formed by using the method of the present invention.

Followed by, plasma was generated by applying DC of 1000 W to the target, and the wafer was subjected to sputtering of Ti atoms constituting the target. Since a reactive gas was used, as illustrated in FIG. 1F, a TiN film was formed on the metal oxide film ($TiO_2$ or $TiO_x$) 106 as a metal electrode film 107.

Figure 3A:
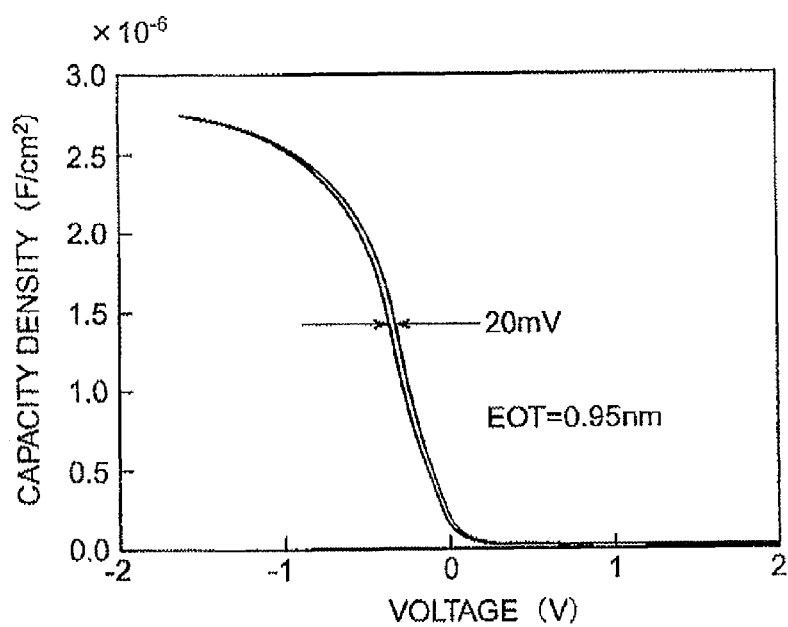
FIG. 3A is a view illustrating results of electric properties obtained by the present invention.
Figure 3B:
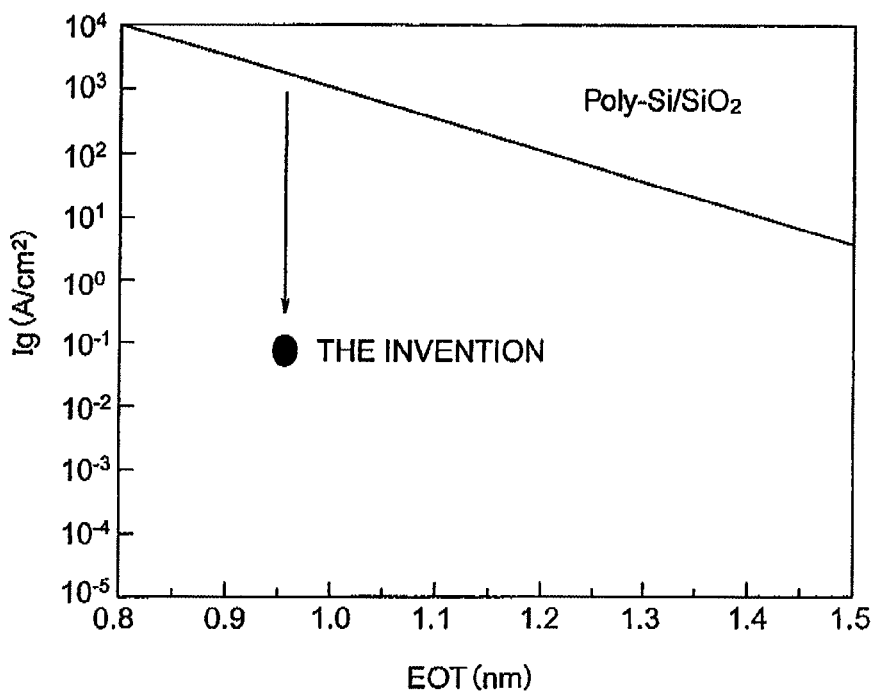
FIG. 3B is a view illustrating other results of electric properties obtained by the present invention.

In FIG. 3A, the C-V characteristics of the stacked structure of high permittivity gate dielectrics and a metal electrode material, formed using this technique is illustrated. From the figure, it is understood that excellent electric properties that are EOT of 0.95 nm and hysteresis value of 20 mV, are obtained. FIG. 3B illustrates the EOT-Ig characteristics (EOT of silicon dioxide v.s. leak current) of the stack structure of the high permittivity gate dielectrics and the metal electrode material formed using this technique. From FIG. 3B, it is understood that the leakage current Ig of the polysilicon electrode can be caused to be lower than that of the silicon dioxide ($SiO_2$) film with a known structure by six order.

Figure 4A:
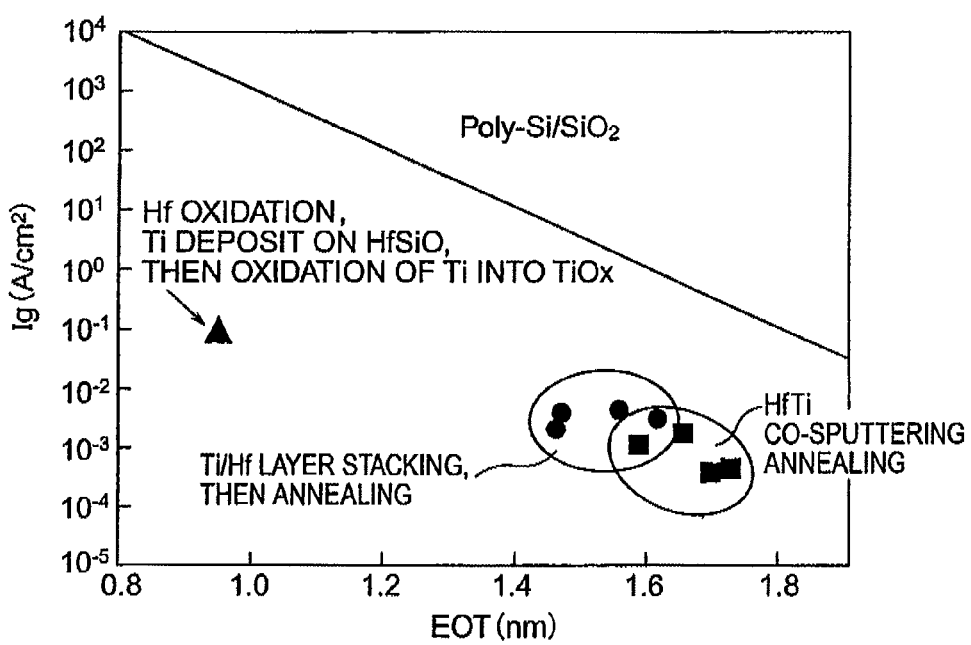
FIG. 4A is a view illustrating analyzed results for comparing stack structures of high permittivity dielectrics formed in another embodiment example of the present invention.

In FIG. 4A, using a stack structure (1) formed by using this sputtering technique, a stack structure (2) of high permittivity gate dielectrics (HfSiO, $TiO_x$) and a metal electrode material, which is formed by forming a HfTi film on a silicon dioxide ($SiO_2$) film by means of simultaneous deposition (co-sputtering) of a Hf target and a Ti target, and subsequently subjecting the stacked structure to a thermal oxidation treatment, a stack structure (3) of high permittivity gate dielectrics (HfSiO, $TiO_x$) and a metal electrode material, which is formed by sequentially depositing Hf/Ti on a silicon dioxide ($SiO_2$) film in a stacked structure by means of sputtering, and subsequently subjecting the stacked structure to a thermal oxidation treatment, comparison results of EOT-Ig (EOT of silicon dioxide v.s. leakage current) characteristics between these structures, are illustrated. It is clearly understood that the stacked structure formed by means of the technique (1) indicated by a triangle enables thinning of the EOT and improvement if the EOT-Ig characteristics. In addition, in the case indicated by (2) where Hf and Ti are simultaneously deposited, the ratios of the Hf target and the Ti target can have at least the following four types of Hf:Ti=1:1, 3:2, 7:3, and 85:15. Since, in the manufacturing method (2) indicated by a square and the manufacturing method (3) indicated by a round, deposition is performed by means of sputtering of a metal target in an atmosphere where oxidation reactions of metal atoms hardly occur, as illustrated in FIG. 4A, resultant Ig and EOT are more excellent that those of a known technique.

Figure 4B:
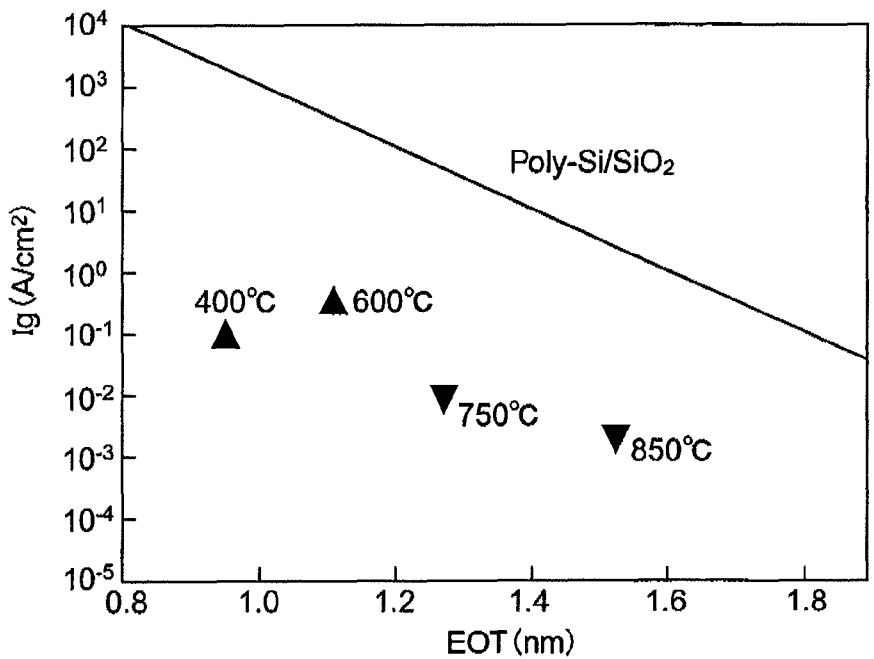
FIG. 4B is a view illustrating other analyzed results for comparing stack structures of high permittivity dielectrics formed in another embodiment example of the present invention.

Moreover, in FIG. 4B, the EOT-Ig characteristics comparing the temperature dependences of $TiO_x$ film formation are illustrated in the structure formed using this technique. If the $TiO_x$ film formation temperature is equal to or smaller than 500° C., the conditions: EOT<1 nm and a low leakage current, are obtained.

Figure 5A:
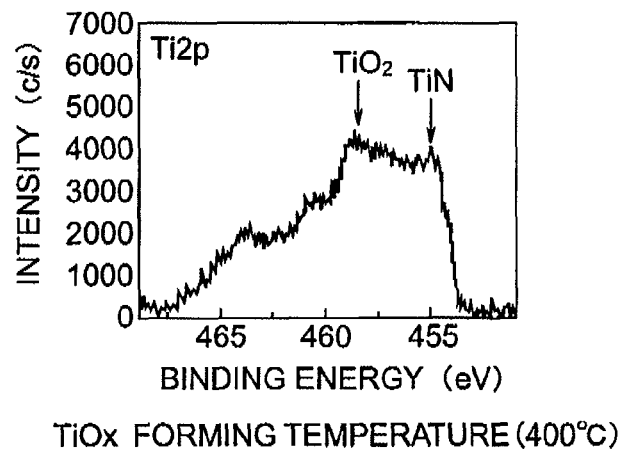
FIG. 5A is a view illustrating analyzed results of stack structures of high permittivity dielectrics formed by the present invention, for comparing TiOx film forming temperature dependence.
Figure 5B:
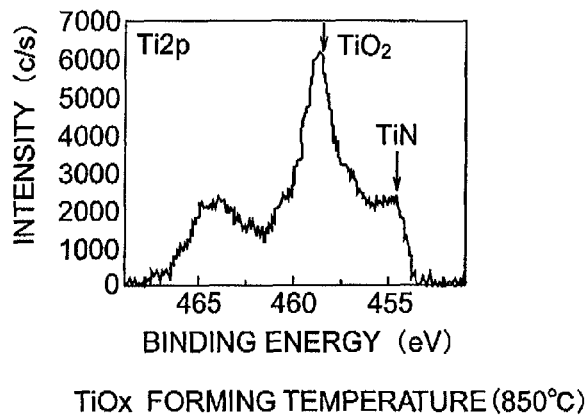
FIG. 5B is a view illustrating other analyzed results of stack structures of high permittivity dielectrics formed by the present invention, for comparing TiOx film forming temperature dependence.

In FIG. 5, the results of XPS analysis from the rear surface of the wafer using the samples in cases where the formation temperatures of the $TiO_x$ film are 400° C. and 850° C., are illustrated, in the stack structure formed using this technique. FIG. 5A illustrates the result of a case where the formation temperature of the $TiO_x$ film is 400° C., and FIG. 5B illustrates the result of a case where the formation temperature of the $TiO_x$ film is 850° C. In the sample of 850° C., the peak of $TiO_x$ is clearly seen in the Hf silicate film. When the formation temperature of $TiO_x$ dielectrics is equal to or smaller than 400° C., a $TiO_x$/Hf silicate film where Ti does not diffuse into the Hf silicate film, can be formed. Formation of $TiO_x$ dielectrics at a low temperature equal to or smaller than 400° C., enables formation of leak paths and increase of the interface-state density to be prevented, enabling degradation of electric properties to be prevented.

Figure 6A:
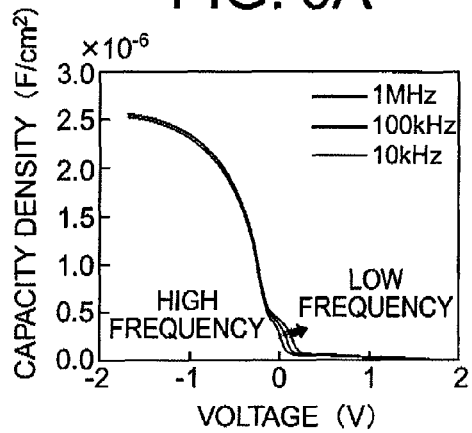
FIG. 6A is a view illustrating results of electronic properties of stack structures of high permittivity dielectrics formed by the present invention, for comparing TiOx film forming temperature dependence.
Figure 6B:
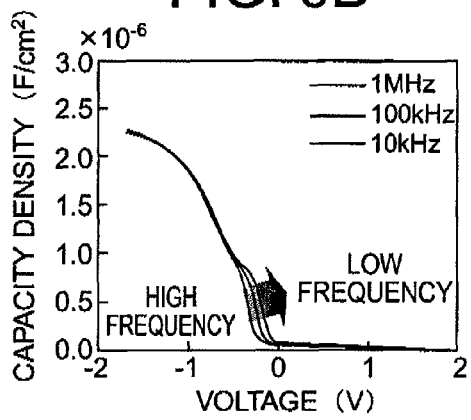
FIG. 6B is a view illustrating other results of electronic properties of stack structures of high permittivity dielectrics formed by the present invention, for comparing TiOx film forming temperature dependence.

Further, in FIGS. 6A and 6B, the frequency dependency of the C—V characteristics in the samples of cases where the formation temperatures of the $TiO_x$ film are 400° C. and 600° C., are illustrated. FIG. 6A illustrates the result of a case where the formation temperature of the $TiO_x$ film is 400° C., and FIG. 6B illustrates the result of a case where the formation temperature of the $TiO_x$ film is 600° C. In the sample of 600° C., it is seen that the frequency dispersion is large. In other words, when the formation temperature of dielectrics is equal to or smaller than 600° C., a curve where the frequency dispersion is small, can be obtained.

In the present invention, it is possible to achieve good electric properties having smaller frequency dispersion, that are, EOT<1 nm, low leakage current, and hysteresis<20 mV.

Although, in the above-mentioned description, a TiN/$TiO_x$/HfSiO/$SiO_2$/Si structure has been described, within the scope of the present invention, the kinds of the metal electrode film to be formed are not limited.

The material of the metal electrode may be a metal such as Ta, Ru, and Hf, a metal nitride such as TiN and HfN, and TaN, a metal alloy such as RuTa and HfTa, a metal-semiconductor alloy such as HfSi and TaSi, a metal-semiconductor alloy nitride such as TaSiN, or a stacked body composed of the above-mentioned films, for example, Hf/TaN/TiN and Ru/Ta/TaN.

Figure 7:
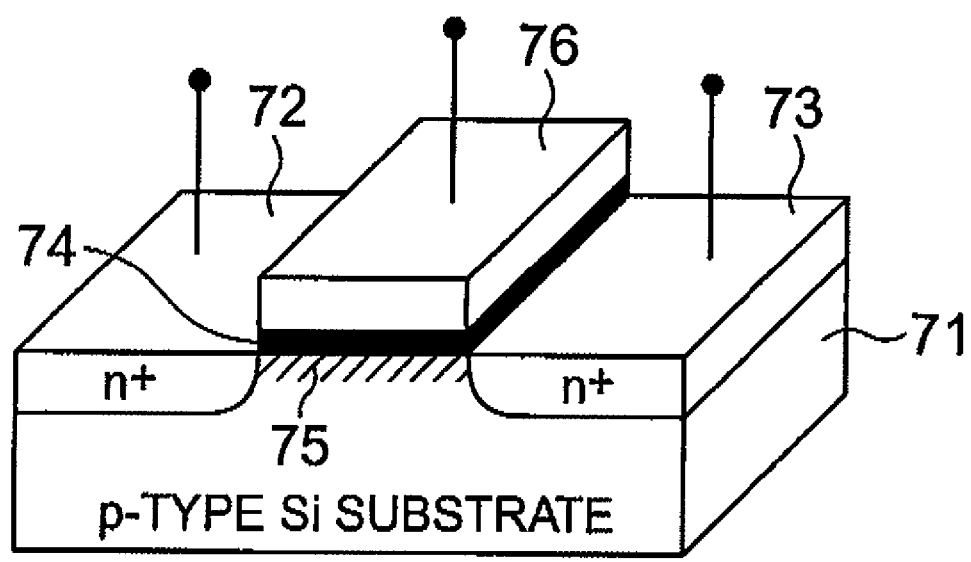
FIG. 7 is a view illustrating of MOSFET including the high permittivity dielectrics formed by the present invention as gate dielectrics.

A MOS-FET 70 including the high permittivity gate dielectrics manufactured according to the present invention is illustrated in FIG. 7. An n+ drain electrode 72, an n+ source electrode 73, and an inversion layer (channel) region 75 are formed on a p-typed silicon wafer 71, high permittivity gate dielectrics layer of $TiO_x$/HfSiO/$SiO_2$ layer 74 formed according to the present invention is disposed on the inversion layer region 75, and a metal electrode TiN (or another metal) 76 is formed on the high permittivity gate dielectrics layer 74, resulting in construction of a gate electrode. In the $TiO_x$/HfSiO/$SiO_2$ layer, formation of a Hf film on a $SiO_2$ film, formation of a $HfSiO_2$ film by means of a thermal oxidation treatment, formation of a Ti film on the $HfSiO_2$ film, and formation of a $TiO_2$ film by means of a thermal oxidation treatment are adopted as preferable embodiment examples. However, except for the above-mentioned methods, according to specifications, it is also possible to sputter and deposit a metal in an atmosphere where oxidation reaction of metal atoms hardly occurs by means of a thermal oxidation treatment after co-sputtering and depositing Ti and Hf, and a thermal oxidation treatment after sequentially sputtering and depositing Ti and Hf. Moreover, as mentioned-above, it is also possible to use a SiON layer in place of the $SiO_2$ layer.

The method of manufacturing the MOS field effect transistor according to the present invention, includes: forming first high permittivity gate dielectrics on the silicon dioxide ($SiO_2$) film or the silicon oxide nitride film; forming second high permittivity gate dielectrics on the first high permittivity gate dielectrics, having a relative permittivity constant differing from that of the first high permittivity gate dielectrics; and forming a metal electrode material on the second high permittivity gate dielectrics, where, at least the formation of the first and the second high permittivity gate dielectrics are performed continuously without exposing the first and the second high permittivity gate dielectrics to atmospheric air.

The first and second high permittivity gate dielectrics are gate dielectrics, and the metal electrode material is the gate electrode.

In the embodiment example, the first high permittivity gate dielectrics is an oxide film including Hf, and the second high permittivity gate dielectrics is an oxide film including Ti, and the metal electrode material includes one kind, or two or more kinds of metal elements selected from the group consisted of Zr, C, Hf, Ta, Ti, Al, Ru, Si, Ni, Pt, Ir, Er, Yb, La, Dy, Y, Gd, Co, and W.

In the embodiment example, the first high permittivity gate dielectrics is HfSiO, and the second high dielectric film is $TiO_2$.

As described above, the above-mentioned specific embodiment examples are not intended to limit the scope of the present invention, and may be enlarged in order to correspond to the content of the subject of the claims of the present invention within the gist disclosed herein.

This application claims priority from Japanese Patent Application No. 2007-178723 filed Jul. 6, 2007, which are hereby incorporated by reference herein.

What is claimed is:

1. A method of manufacturing a MOS field effect transistor with a high permittivity gate dielectrics layer, comprising:
    forming first high permittivity gate dielectrics on a silicon dioxide ($SiO_2$) film or a silicon oxynitrided (SiON) film;
    forming second high permittivity gate dielectrics having a relative permittivity constant being different from that of the first high permittivity gate dielectrics; and
    forming a metal electrode film on the second high permittivity gate dielectrics,
    wherein the first and second high permittivity gate dielectrics constitute the high permittivity gate dielectrics layer,
    wherein the formation of the first high permittivity gate dielectrics comprises:
    a first step for depositing a first metal film containing Hf on the silicon dioxide ($SiO_2$) film, or silicon oxynitrided (SION) film, by means of a sputtering method using a metal target in an atmosphere where oxidation reaction of metal atoms hardly occurs; and
    a second step for forming the first high permittivity gate dielectrics of HfSiO by subjecting the first metal film and the silicon dioxide ($SiO_2$) film or the silicon oxynitrided (SiON) film to a thermal oxidation treatment at a temperature of 500° C. to 900° C.,
    wherein the formation of the second high permittivity gate dielectrics comprises:
    a third step for depositing a second metal film of Ti on the first high permittivity gate dielectrics of HfSiO, by means of a sputtering method using a metal target of Ti in an atmosphere where oxidation reaction of metal atoms hardly occurs; and
    a fourth step for forming the second high permittivity gate dielectrics of $TiO_2$ by subjecting the second metal film of Ti to a thermal oxidation treatment at a temperature lower than 500° C., and
    wherein a EOT (Equivalent Oxide Thickness) of the high permittivity gate dielectrics layer is 1.0 nm or less and a leakage current thereof is $10^{-1}$ $A/cm^2$ or less, and
    the first to fourth steps are sequentially performed without exposing the first and second metal films and the resultant first and second high permittivity gate dielectrics to atmospheric air.

2. The method of manufacturing a MOS field effect transistor with a high permittivity gate dielectrics layer according to claim 1, wherein the second step is performed at an oxidation treatment pressure of $1\times10^{-3}$ [Pa] to 10 [Pa].

3. The method of manufacturing a MOS field effect transistor provided with a high permittivity gate dielectrics layer according to claim 1, wherein the fourth step is performed at a heating temperature of 200° C. to 400° C.

4. The method of manufacturing a MOS field effect transistor provided with a high permittivity gate dielectrics layer according to claim 1, wherein the fourth step is performed at a heating temperature of 200° C. to 400° C. and at an oxidation treatment pressure of $1\times10^{-3}$ [Pa] to 10 [Pa].

5. The method of manufacturing a MOS field effect transistor provided with a high permittivity gate dielectrics layer according to claim 1, wherein the metal electrode film is formed by means of a reactive sputtering method using deposition equipment enabling oxygen and nitrogen or nitrogen monoxide, or oxygen and nitrogen to be introduced simultaneously.

6. The method of manufacturing a MOS field effect transistor provided with a high permittivity gate dielectrics layer according to claim 1, wherein the metal electrode film comprises metal composite films of a binary or more system formed by discharging at least two or more cathodes simultaneously.

7. The method of manufacturing a MOS field effect transistor provided with a high permittivity gate dielectrics layer according to claim 1, wherein the metal electrode film includes one or more metal elements selected from the group consisting of Zr, C, Hf, Ta, Ti, Al, Ru, Si, Ni, Pt, Ir, Er, Yb, La, Dy, Y, Gd, Co, and W.

* * * * *